United States Patent
Zach et al.

(10) Patent No.: US 7,807,965 B2
(45) Date of Patent: Oct. 5, 2010

(54) CORRECTOR FOR AXIAL AND OFF-AXIAL BEAM PATHS

(75) Inventors: Joachim Zach, Oestringen (DE); Harald Rose, Darmstadt (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 262 days.

(21) Appl. No.: 12/230,632

(22) Filed: Sep. 3, 2008

(65) Prior Publication Data

US 2009/0146056 A1    Jun. 11, 2009

(30) Foreign Application Priority Data

Dec. 5, 2007   (DE) ...................... 10 2007 058 443

(51) Int. Cl.
*H01J 37/153*   (2006.01)
*H01J 37/26*    (2006.01)
*G21K 1/08*     (2006.01)

(52) U.S. Cl. .................................. 250/311; 250/396 R

(58) Field of Classification Search ............. 250/396 R, 250/396 ML, 398, 311, 310, 306, 307
See application file for complete search history.

(56) References Cited

U.S. PATENT DOCUMENTS

| | | | |
|---|---|---|---|
| 6,888,145 B2 * | 5/2005 | Muller et al. | 250/396 ML |
| 7,012,261 B2 * | 3/2006 | Kawai et al. | 250/396 R |
| 7,321,124 B2 * | 1/2008 | Rose | 250/396 ML |
| 2008/0283749 A1 * | 11/2008 | Muller et al. | 250/311 |
| 2009/0101818 A1 * | 4/2009 | Zach | 250/311 |

FOREIGN PATENT DOCUMENTS

WO   WO 2007/065382    6/2007

OTHER PUBLICATIONS

O. Schwerzer "Spaerische und chromatische Korrektur von Elektronen-Linsen". Optik, DE, Jena, 1947, Pa. 114-132.
Joachim Zach "Aberration correction in a low voltage SEM by a multipole corrector". Nuclear Instruments and Methods in Physics Research A 363 (1995) 316-325.
H. Rose "Elektronenoptische Aplanate", Wissenschaftliche Verlagsgesellschaft mbH Stuttgart, Sonderabdruck 34, Band (1971) Pa. 285-311.

* cited by examiner

*Primary Examiner*—Jack I Berman
(74) *Attorney, Agent, or Firm*—Paul Vincent

(57) ABSTRACT

A corrector (1) for the axial and off-axial beam path of a particle-optical system, comprises a first (10) and a second (20) correction piece, which are disposed one behind the other in the beam path (2) on an optical axis (3). Each correction piece (10, 20) comprises four successive multipole elements (11, 12, 13, 14; 24, 23, 22, 21) disposed symmetrically with respect to a center plane (5) and with the following fields: wherein the first (11; 24) and the fourth (14; 21) multipole elements of the multipole elements (11, 12, 13, 14; 24, 23, 22, 21) are used to generate quadrupole fields (11', 14'; 24', 21') and the second (12; 23) and third (13; 22) are used to generate octupole fields (12''', 13'''; 23''',22''') and quadrupole fields (12', 13'; 23',22'), wherein the latter are superposed magnetic (12', 13'; 23', 22') and electric fields (12'', 13''; 23'', 22''), wherein the quadrupole fields (11', 12', 13', 14'; 24', 23', 22', 21') of all four multipole elements (11, 12, 13, 14; 24, 23, 22,21) are rotated from one to the next through 90°. An astigmatism of third order is corrected by a central multipole element disposed in the center plane and generating an octupole field.

11 Claims, 5 Drawing Sheets

CORRECTOR FOR AXIAL AND OFF-AXIAL BEAM PATHS

This application claims Paris Convention priority of DE 10 2007 058 443.3 filed Dec. 5, 2007 the complete disclosure of which is hereby incorporated by reference.

BACKGROUND OF THE INVENTION

The invention concerns a corrector for axial and off-axial beam paths of a particle-optical system, comprising a first and a second correction piece, which are successively disposed in the beam path on an optical axis, wherein each correction piece comprises four successive multipole elements disposed symmetrically with respect to a center plane and with the following fields, wherein the first and the fourth multipole elements are used to generate quadrupole fields, and the second and the third multipole elements are used to generate octupole fields and quadrupole fields, wherein the latter are superposed magnetic and electric fields, and wherein the quadrupole fields of all four multipole elements are successively rotated from one to the other through 90°, such that chromatic aberration correction can be performed through interaction between the magnetic and electric fields using astigmatic intermediate images in the second and third multipole elements, and aperture aberration correction can be performed using the quadrupole fields and the octupole fields. The invention also concerns a transmission electron microscope comprising a corrector of this type.

Particle-optical systems are advantageous compared to light optics in that they provide a considerably better resolution due to the shorter wavelength of electrons and ions. Achieving the theoretically possible resolution limit of half a wavelength is complicated by the fact that the lenses that are used operate with magnetic or electric fields and exhibit numerous lens aberrations.

Such lens aberrations can be subdivided into chromatic aberrations and geometrical image aberrations. The chromatic aberrations are caused by the fact that the imaging electrons or ions have different velocities and therefore different wavelengths. This is mainly due to the fact that the electrons (or ions) emitted for generating the beam have a certain energy beam width.

The geometrical image aberrations are mainly due to inaccurate imaging by the electromagnetic fields which must obey the Laplace equation. This produces aperture aberrations because the focal length of the outer lens zones is smaller than that of the inner lens zones. In consequence thereof, a point in the image plane is no longer imaged as a point. A further source of aberrations results from the fact that the lenses are not completely symmetrical and therefore the strength of the lenses differs in two directions perpendicular to the optical axis. This aberration is called astigmatism. There are, however, further image aberrations, the cause of which is not always known.

Image aberrations occur in the form of axial image aberrations when an axial point is imaged. The beam dependence for imaging the latter, is determined by the dependence of the axial fundamental paths $x_\alpha$ and $y_\beta$ that start from the axial point of the object plane and lie in the x and y sections. Image aberrations also occur in the form of off-axial image aberrations for imaging an off-axial image point. The beam path for off-axial imaging is determined by the dependence of the off-axial fundamental paths $x_\gamma$ and $y_\delta$ that start from a point on the object plane at some distance to the axis, and lie in the x- and y section.

Due to the diffraction dependence of the beams, these aberrations occur in several orders. The geometrical image aberrations are thereby visible in the form of characteristic aberration figures that surround the axis. These occur e.g. from second to fifth order in the form of the following aberrations: second order: three-fold axial astigmatism, axial coma, third order: four-fold axial astigmatism, aperture aberration, axial star aberration, fourth order: five-fold axial astigmatism, axial coma, axial trilobe aberration, fifth order: six-fold axial astigmatism, aperture aberration, axial star aberration, axial rosette aberration, . . . etc. The multiplicity thereby indicates the number of star corners of the associated image aberration figure. Aberrations starting from fourth order are also called aberrations of higher order.

Geometrical image aberrations are mainly caused by the objective lens, but also by other lenses and by the corrector itself. These aberrations are corrected by the corrector through downstream as well as upstream compensation, wherein the correction measure always depends on the result of the final image.

The basis for the correction of the axial image aberrations are the findings of O. Scherzer (O. Scherzer: "Sphärische und chromatische Korrektur von Elektronen-Linsen" (spherical and chromatic correction of electron lenses), OPTIK, DE, JENA, 1947, pages 114-132, XP002090897, ISSN: 0863-0259), that show that the correction of spherical (i.e. geometrical) and chromatic (i.e. color) aberrations is possible for particle beams by using non-rotationally symmetrical fields. Astigmatic intermediate images are thereby generated and correction is successively performed in an intermediate image in the x plane, and then in an intermediate image in the y plane which is perpendicular thereto. The eccentricity of the beam is subsequently eliminated again by reuniting it into a round beam. O. Scherzer establishes the conditions required to achieve these corrections (loc. cit.). These conditions, which are called the Scherzer theorem, form the basis of any axial aberration correction in particle optics. The correction of off-axial aberrations requires no astigmatic intermediate images. It can be performed with round or multipole fields.

For correcting non-round aberrations, such as e.g. astigmatism, a non-round field is required in order to restore the beam to its round cross-section, e.g. in the case of astigmatism, or to counteract non-roundness causing other non-round aberrations.

Departing therefrom, Rose (Optik, Volume 34, 1971, pages 285-311, in particular to page 293) proposes a corrector of the above-mentioned type that achieves relatively extensive aperture correction, wherein the corrector itself produces almost no aberrations. This corrector, however, was not further examined, since it is disadvantageous compared to other proposals made therein. In particular, the astigmatism of third order would be difficult to eliminate with the corrector of the above-mentioned type, thereby unavoidably causing aberrations of higher order.

It is therefore the underlying purpose of the invention to also eliminate the astigmatism of third order without introducing disturbing aberrations of higher order. Moreover, additional measures are taken for eliminating aberrations up to higher orders in order to achieve a satisfactory image resolution of up to approximately 5000 image points along an image diameter.

SUMMARY OF THE INVENTION

The object is achieved in accordance with the invention in that a central multipole element disposed in the center plane generates an octupole field for eliminating the astigmatism of third order.

Due to the fact that the octupole field of the central multipole field also eliminates the astigmatism of third order, the corrector can largely eliminate the aberrations of the objective lens, of other lenses, and also the aberrations caused by itself up to higher orders, or even prevent them from being generated through corresponding adjustment of the above-mentioned quadrupole and octupole fields. Further improvements can be obtained by means of further embodiments that can be derived from the dependent claims.

All fields of the two correction pieces and of the central multipole element, except for the quadrupole fields of the second and third multipole elements of the two correction pieces, may thereby be magnetic or electric fields or a combination of both.

The inventive corrector is initially based on the conventional procedure that, according to the teachings of O. Scherzer (loc.cit.), the quadrupole field of the first multipole element gives the beam a deviation from rotational symmetry, such that the fundamental paths $x_\alpha$ and $y_\beta$ extend with different divergences in two main, mutually perpendicular, x and y sections. The fundamental paths $x_\alpha$ and $y_\beta$ thereby represent the outer limits of the axial beams in the x and y plane. The subsequent quadrupole field of the second multipole element, which is rotated through 90°, can only influence the beam of one section, e.g. the x section, which has no zero passage, but not the part of the beam that has a zero passage at this location (y section). This beam (x section) is thereby deflected in such a fashion that it extends parallel to the beam of the other section (y section). The other beam section is deflected by the same amount in the quadrupole field of the third multipole element, which, in turn, is rotated through 90°, such that the beams of the orthogonal main sections again move towards each other in order to be reunited into a round beam bundle by the quadrupole field of the fourth multipole element. The above-mentioned deviations from rotational symmetry are used for chromatic and aperture aberration correction according to the Scherzer theorem (loc.cit.)

The practical realization of axial aberration correction initially provides chromatic aberration correction with respect to one section, e.g. the x section, using the second multipole element of the first correction piece and the third multipole element of the second correction piece. With respect to the other section, e.g. the y section, correction is performed with the third multipole element of the first correction piece and the second multipole element of the second correction piece. The correction is thereby performed in the area of the four astigmatic intermediate images of the corrector. The function of the chromatic aberration correction corresponds to the conventional Wien filter and is based on the fact that the quadrupole fields consist of superposed electric and magnetic quadrupole fields. The field strengths are thereby designed in such a fashion that electrons of a certain velocity, i.e. of a certain energy (in light optics, of a certain color) pass the fields on their predetermined path. The electrons of differing energies leave the predetermined path, whereby it is possible to counter-compensate the chromatic aberration of the round lenses of the microscope, in particular of the objective lens. The combination of electric and magnetic fields is therefore only required for this chromatic aberration correction. Half of the correction is performed in the first correction piece and the other half in the second correction piece.

With respect to aperture aberrations, the correction is also performed in the astigmatic intermediate images, i.e. in the second and third multipole elements of each correction piece using their octupole fields. The aperture aberrations are due to the rotationally symmetrical lenses of particle-optical systems, since these have a stronger influence on the beams that extend at a greater distance from the optical axis. In consequence thereof, the beams in the area of intermediate images do not form a common point of intersection with the optical axis. In the area of the astigmatic intermediate images, the beams of the section without zero passage can be influenced by the octupole fields in such a fashion that the beams intersect again in the image plane. If correction of the beams of each section is performed successively and these beams are then reunited into a round beam, the aperture aberration correction is finished. It is thereby not only possible to correct aperture aberrations of upstream round lenses but also to precompensate aberrations of downstream round lenses. The beam path is then given an aperture aberration which is cancelled again with the aperture aberrations of the downstream round lenses, e.g. of the objective. Half of the aberration correction is thereby again performed in the first correction piece, and the other half in the second correction piece, wherein, in particular, the aperture aberration of third order is successively eliminated by the octupole fields of the first correction element and the octupole fields of the second correction element.

With respect to off-axial beams whose limits in the x and y planes are shown by the fundamental paths $x_\gamma$ and $y_\delta$, the first quadrupole also causes a deviation from rotational symmetry, the second quadrupole causes deflection of the beams of one plane, the third quadrupole causes deflection of the beams in the other plane and the fourth quadrupole causes recombination into a round beam. However, no intermediate images are generated.

The above-described also applies for the second correction piece, because it is constructed identical to the first, but the multipole elements are disposed in reverse order, wherein the axial beam path ($x_\alpha$ and $y_\beta$) extends symmetrically, i.e. mirror-symmetrically, and the off-axial beam path ($x_\gamma$ and $y_\delta$) extends anti-symmetrically, i.e. point-symmetrically. Since the correction pieces are symmetrical with respect to the center plane, and the off-axial fundamental paths extend in an anti-symmetrical fashion, the corrector itself does not cause any substantial geometrical optical aberrations in the off-axial range. This is because the off-axial aberrations caused in the first correction piece are eliminated by the opposite effect of the second correction piece due to the symmetrical arrangement of the fields. However, aberration curves which do not extend symmetrically or anti-symmetrically about the center plane through the corrector thereby constitute an exception and generate aberrations, which are, however, of higher order.

Axial aberrations remain, which are caused by the optical system in which the corrector is arranged, or by the corrector itself. An astigmatism of third order is thereby most serious and is generated in the corrector by the aperture aberration correction.

The basic idea of the invention consists in eliminating this latter aberration through arrangement of a multipole element for generating an octupole field, wherein the arrangement in the center plane in which both off-axial fundamental paths $x_\gamma$ and $y_\delta$ cross the axis, ensures that this multipole element itself does not cause any new off-axial aberrations.

Further developments of the corrector eliminate further aberrations of higher orders.

The aperture aberration of third order corrected as mentioned above, is e.g. one of the above-mentioned exceptions of causing an aberration in the corrector through an aberration curve that does not extend symmetrically or anti-symmetrically. This aperture aberration of third order causes axial aberrations of fifth order at locations where it is still large and where octupoles are present. Since the correction of the aperture aberration of third order is performed successively as mentioned above, the cause of aberration in the first correction piece cannot be cancelled by the corresponding cause of aberration in the second correction piece. These axial aberrations of fifth order are four aberrations: an aperture aberration, a star aberration, a rosette aberration and an astigmatism (of fifth order each). For this reason, it is proposed to generate twelve-pole fields using the second and third multipole elements of the first correction piece and the central multipole element for correcting aberrations of fifth order. This arrangement in the first correction piece and in the central multipole element is sufficient for correction of three of these four aberrations. Each twelve-pole field may thereby be used to correct these four aberrations. The aperture aberrations of fifth order which are subsequently caused in the second correction piece, but to a much smaller extent, are included in this compensation, such that imaging aberrations are eliminated.

These twelve-pole fields suitably correct the star aberration of fifth order, the rosette aberration of fifth order, and the astigmatism of fifth order. The reason why these three aberrations are selected for correction consists in that correction of these eccentric aberrations requires the use of non-round fields. The aperture aberration of fifth order may also be corrected using a round field. A corresponding proposal is given below.

One remaining off-axial aberration is a coma of the objective lens formed as a magnetic lens. This coma occurs in the form of isotropic and anisotropic coma, wherein the isotropic coma is substantially not problematic, since it can be eliminated through suitable excitation of the round lenses. For this reason, a further development is limited to the generation of further octupole fields which are rotated through 22.5° with respect to the above-mentioned octupole fields of the aperture aberration correction for correcting anisotropic coma of the objective lens. These rotated octupole fields are generated within all multipole elements that generate the quadrupole fields, wherein the octupole field strengths are anti-symmetrical with respect to the symmetry planes of the correction pieces and also anti-symmetrical with respect to the center plane. These further octupole fields are thereby all oriented in the same orientation relative to each other.

In order to be able to generate the different fields by the multipole elements that are provided, at least the second and third multipole elements of the first and second correction pieces and the central multipole element are suitably twelve-pole elements which can generate different fields, up to twelve-pole fields, including superposition of different fields using a controller through corresponding current and/or voltage loads. This is explained below in the description of the drawing with reference to one illustration.

The characterization of the fields of the corrector to that effect that settings and adjustments or readjustments can be made to eliminate aberrations, means the following: The structural design of electrodes and/or electromagnets and the possibility of loading them with a current or voltage must be such that the above-stated correction measures can be taken after installation of the corrector into a particle-optical system, e.g. into an electron microscope. These settings, adjustments and readjustments are made after installation and putting into operation of the respective particle-optical system, e.g. the electron microscope, since the exact settings depend both on its construction as well as on the individual lens aberrations, which may be different even for devices of the same model range, e.g. due to dimensional inaccuracies and material inhomogeneities. Readjustment is required from time to time during operation of the devices, since even the slightest soiling can change the optical properties, requiring readjustment. The invention is realized in a corrector which permits this type of correction of the electron beam. The realization of the structural design of the corrector and the exactly available current and/or voltage ranges which are required for the settings and corrections depend on the structural type of the respective device, in particular, on the respective beam voltages, the feasible working ranges and the exact design of the lens system.

In order to also correct the above-mentioned aperture aberrations of fifth order or a correlated, although small, radial coma of third order or reduce them to a tolerable degree, the invention proposes to allocate two transfer lenses, formed as round lenses, to the corrector on the objective side, the field setting of which can eliminate the aperture aberrations of fifth order and/or radial coma of third order or reduce them to a tolerable degree.

This measure, however, also produces aberrations and, in particular, causes partial cancellation of the correction of the aperture aberration of third order and chromatic aberration correction. For this reason, the invention proposes readjustment of the quadrupole and octupole fields of the second and third multipole elements of the first and second correction pieces and of the octupole field of the central multipole element, such that the above-mentioned newly caused chromatic aberrations of first order and aperture aberrations of third order are eliminated again. During readjustment of the quadrupole fields, the magnetic and electric fields must be simultaneously adjusted such that the chromatic aberration correction is maintained as described above. A deviation from this simultaneous adjustment is, however, required to readjust a chromatic aberration that occurs again due to the setting of the transfer lenses.

Since insertion of the transfer lenses and any adjustment, such as the above-mentioned readjustment, changes the beam path again, readjustment of the twelve-pole fields of the second and third multipole element of the first corrector and of the twelve-pole field of the central multipole element is preferably possible in order to eliminate again the aberrations of higher, in particular, fifth order caused by the transfer lenses and the above-mentioned readjustment. The further, rotated octupole fields must then be correspondingly readjusted.

The problem of the above-mentioned readjustments consists in that any measure will change the beam path, with the result that previously eliminated aberrations recur, although in a weakened form. For this reason, it is suitable to eliminate the chromatic aberrations of first order, aperture aberrations of third order, and aberrations of higher order, which recur due to aberration corrections, through readjustment of transfer lenses, quadrupole fields of the first and second correction pieces and octupole fields of the first and second correction pieces, and of the central multipole element, then of twelve-pole fields of the first correction piece and of the central multipole element, and then of the further octupole fields of all multipole elements that generate quadrupole fields, and also iterative adjustment in the above-mentioned steps for reducing the aberrations caused by the respective previous readjustments, until they are reduced to an amount that can be tolerated for the desired imaging. This iterative setting naturally only helps to approach an optimum, which cannot be reached. The target is reached when the residual aberrations are minimized to such an extent that they no longer disturb imaging.

In particular, for use of the corrector in imaging systems, such as electron microscopes, it may be suitable to achieve an image resolution of up to approximately 10,000 image points along an image diameter by allowing a small aperture aberration of fifth order.

The corrector is mainly used in transmission electron microscopes, in which beams of a relatively large diameter are used, and for this reason, the correction of the off-axial beam path is also very important. The degree of aberration elimination or aberration toleration thereby depends on the desired image resolution or the desired image size. For high image resolution, aberrations must be eliminated to a larger degree, however, with a smaller image size. For large image sizes, however, residual aberrations and thereby a smaller resolution can be tolerated.

The invention including its further developments provide a corrected system which has no axial aberrations up to sixth order, wherein the aberrations of seventh order and the off-axial aberrations are tolerably small.

The following drawings show schematic views, and field and path dependences for illustrating the invention.

DESCRIPTION OF THE PREFERRED EMBODIMENT

Figure 1:
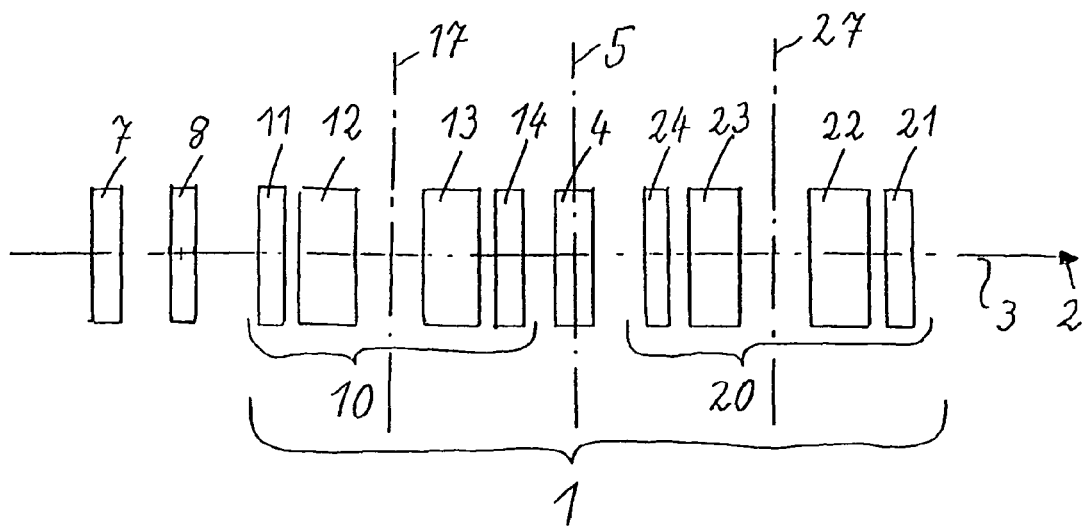
FIG. 1 shows a schematic diagram of the inventive corrector.

All illustrations are shown in accordance with the following system:

Identical reference numerals always show identical parts, field dependences etc. All reference numerals between 11 and 19 thereby relate to the first correction piece 10, and all reference numerals between 21 and 28 relate to the second correction piece 20. The correction piece 10 has multipole elements 11, 12, 13, 14, and the correction piece 20 has multipole elements 21, 22, 23, 24. The multipole elements with the same final digits have the same construction and generate identical fields with respect to the basic functions of the invention in accordance with FIG. 2. The reverse order of the reference numerals shown in FIG. 1, i.e. first 11, second 12, third 13 and fourth 14 multipole elements of the correction piece 10, and first 24, second 23, third 22, and fourth 21 multipole elements of the correction piece 20, symbolizes the symmetry with respect to the center plane 5, with reverse order of the multipole elements 24, 23, 22, 21 of the second correction piece 20 compared to the first correction piece 10. The fields generated by the above-mentioned multipole elements 11, 12, 13, 14; 24, 23, 22, 21 correspond to this system and have the same numbers as the respectively generating multipole element but are shown with dashes. One dash thereby designates the quadrupole fields 11', 12', 13', 14'; 24', 23', 22', 21', two dashes designate the electric quadrupole fields 12", 13"; 23", 22", and three dashes designate the octupole fields 12''', 13'''; 23''', 22''' of the basic function according to FIG. 2. The field designations of further embodiments can differ from this scheme.

FIG. 1 shows a schematic diagram of the construction of the inventive corrector 1 with the optical axis 3 of the beam path 2 and two upstream transfer lenses 7 and 8. The corrector 1 consists of two correction pieces 10 and 20, whose construction and basic function are symmetrical with respect to the center plane 5 in accordance with FIG. 2. A central multipole element 4 is located in this center plane 5. The correction piece 10 has four multipole elements, a first 11, a second 12, a third 13, and a fourth 14 multipole element. The correction piece 20 has identical multipole elements in reverse order, i.e. a first 24, a second 23, a third 22 and a fourth 21 multipole element. The two correction pieces 10 and 20 themselves have symmetry planes 17 and 27, such that the following multipoles have the same construction and basic functions, i.e. the first 11 and the fourth 14, the second 12 and the third 13 of the first correction piece 10, and the first 24 and the fourth 21, and the second 23 and the third 22 of the second correction piece 20. In this fashion, a double symmetry is formed by the symmetry planes 17 and 27 and also by the center plane 5.

Figure 2:
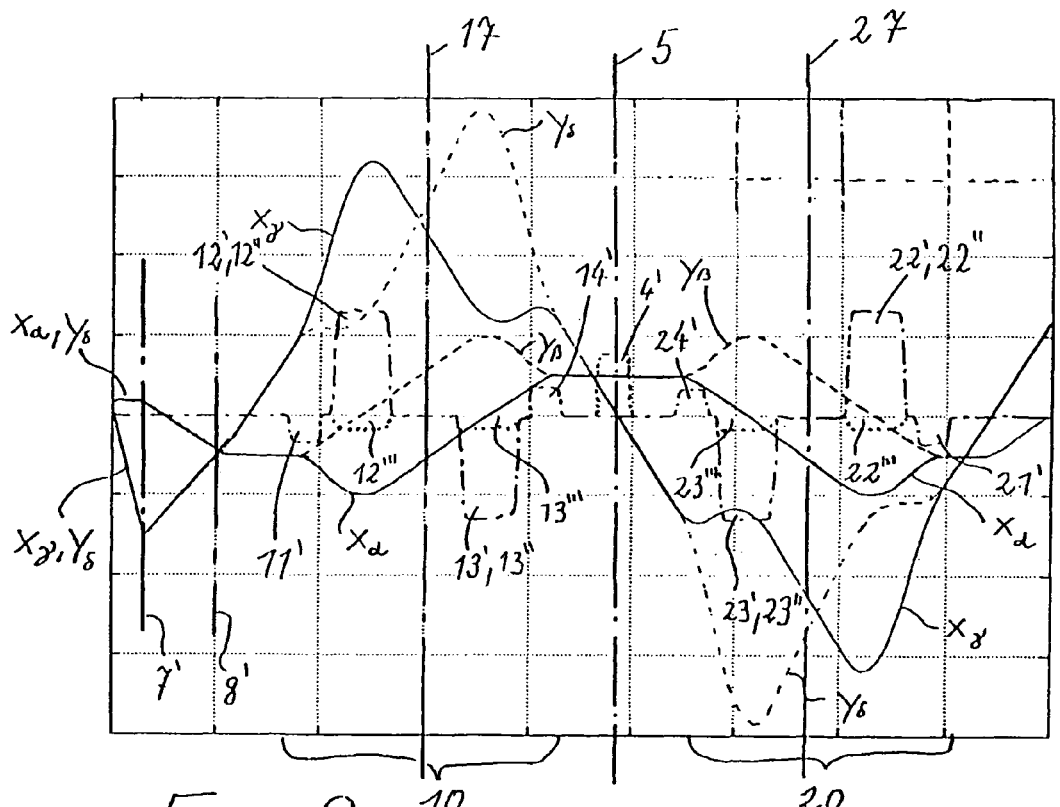
FIG. 2 shows the path and field dependences in correspondence with FIG. 1.

FIG. 2 shows the basic function of the path and field dependences of the inventive corrector 1 in correspondence with FIG. 1, wherein the positions 7', 8' of the transfer lenses 7 and 8 are additionally shown in accordance with a further embodiment of the corrector. The positions of the symmetry planes 17 and 27 and the center plane 5 also correspond to FIG. 1.

The multipole elements 11, 12, 13, 14; 24, 23, 22, 21 generate the following fields, which correspond as mentioned above: the first and fourth multipole elements 11 and 14 and 24 and 21 generate quadrupole fields 11', 14'; 24', 21'. The second and third multipole elements 12, 13; 23 and 22 generate magnetic quadrupole fields 12', 13'; 23', 22' and also electric quadrupole fields 12", 13"; 23", 22" which are used together for chromatic aberration correction, as described above.

These multipole elements 12, 13; 23, 22 continue to generate octupole fields 12''', 13'''; 23''', 22''' which are used for aperture aberration correction as mentioned above. In order to also eliminate astigmatism of third order, a central multipole element 4 arranged in the center plane 5 generates an octupole field 4'.

Figure 3:
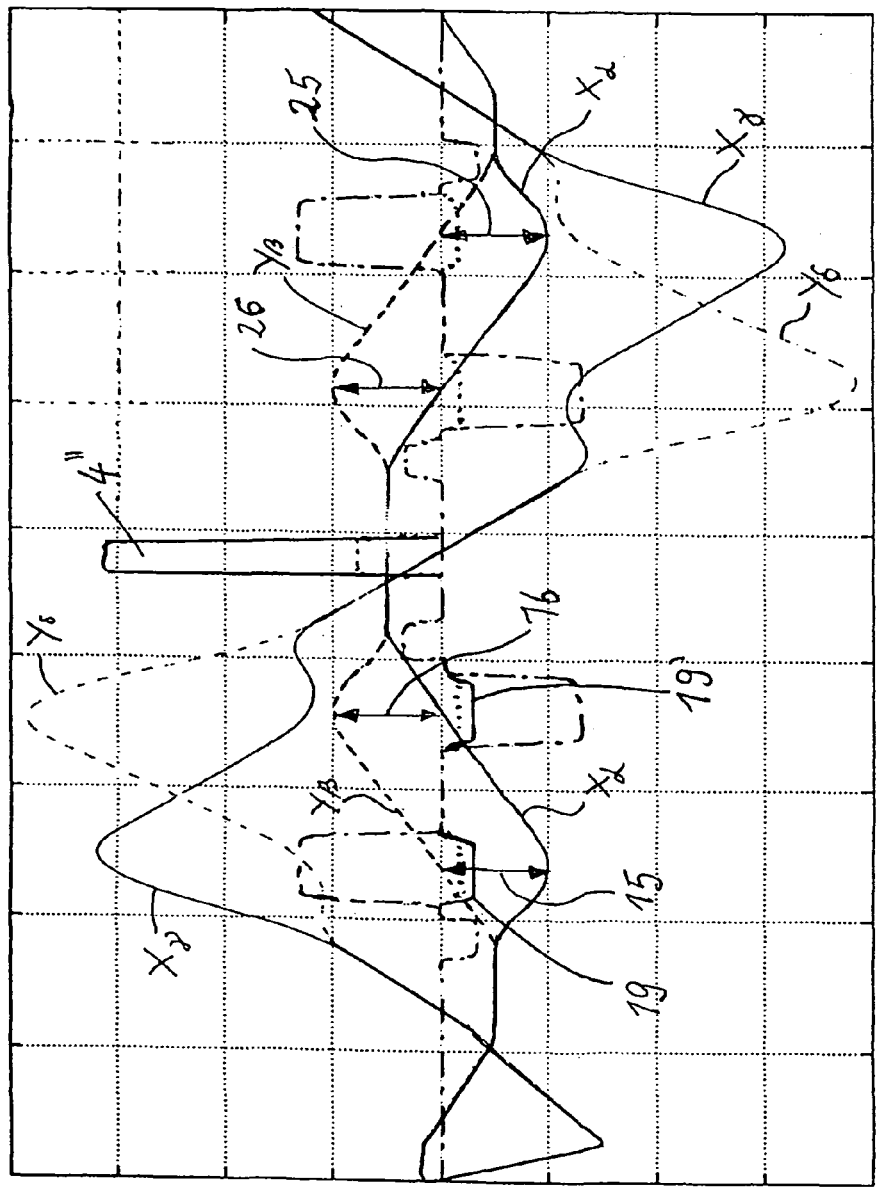
FIG. 3 shows the path and field dependences of FIG. 2 with additional twelve-pole fields.

The illustrated path dependences are obtained by means of the quadrupole fields 11', 12', 13', 14'; 24', 23', 22', 21'. The path dependences are shown in an x and y plane. The paths $x_\alpha$ and $y_\beta$ which are called axial fundamental paths are the paths of the image of an axial image point. The paths $x_\gamma$ and $y_\delta$, which are called off-axial fundamental paths, however, are the paths of the image of an off-axial image point. As can be gathered, the axial fundamental paths $x_\alpha$ and $y_\beta$ of the beams of the x and y section extend in a different fashion due to the first quadrupole field 11', which produces an astigmatic intermediate image 15 in the second multipole element 12 (the astigmatic intermediate images 15, 16; 26, 25 are indicated in FIG. 3 in order to avoid confusion in the view of FIG. 2). A deflection of $x_\alpha$ using the second quadrupole field 12' rotated through 90° with respect to the first quadrupole field 11' then generates a second astigmatic intermediate image 16 in the multipole element 13. Therein, the fundamental beams $x_\alpha$ and $y_\beta$ are guided towards each other through a 90° rotation of the quadrupole field 13' through deflection from $y_\beta$, wherein the fundamental paths $x_\alpha$ and $y_\beta$ are reunited into a round beam by the quadrupole field 14' which is rotated through 90° with respect to the above-mentioned quadrupole field 13'. The same procedure is repeated in the correction piece 20 in a mirror-symmetrical fashion.

The quadrupole fields 11', 12', 13', 14'; 24', 23', 22', 21' may thereby be electric or magnetic fields. It is only important that the quadrupole fields 12" 13"; 23", 22", which are required for chromatic aberration correction, are magnetic when the first ones are electric or vice versa. In the nomenclature of the illustration, the quadrupole fields 12', 13'; 23', 22' are defined as magnetic and the quadrupole fields 12", 13"; 23", 22" are defined as electric. These cooperating fields are essential for chromatic aberration correction in the above-mentioned fashion according to the above-described teaching by Scherzer.

The above-described aperture aberration correction in accordance with the teaching by Scherzer is also used in the field of astigmatic intermediate images 15, 16; 25, 25.

Figure 4:
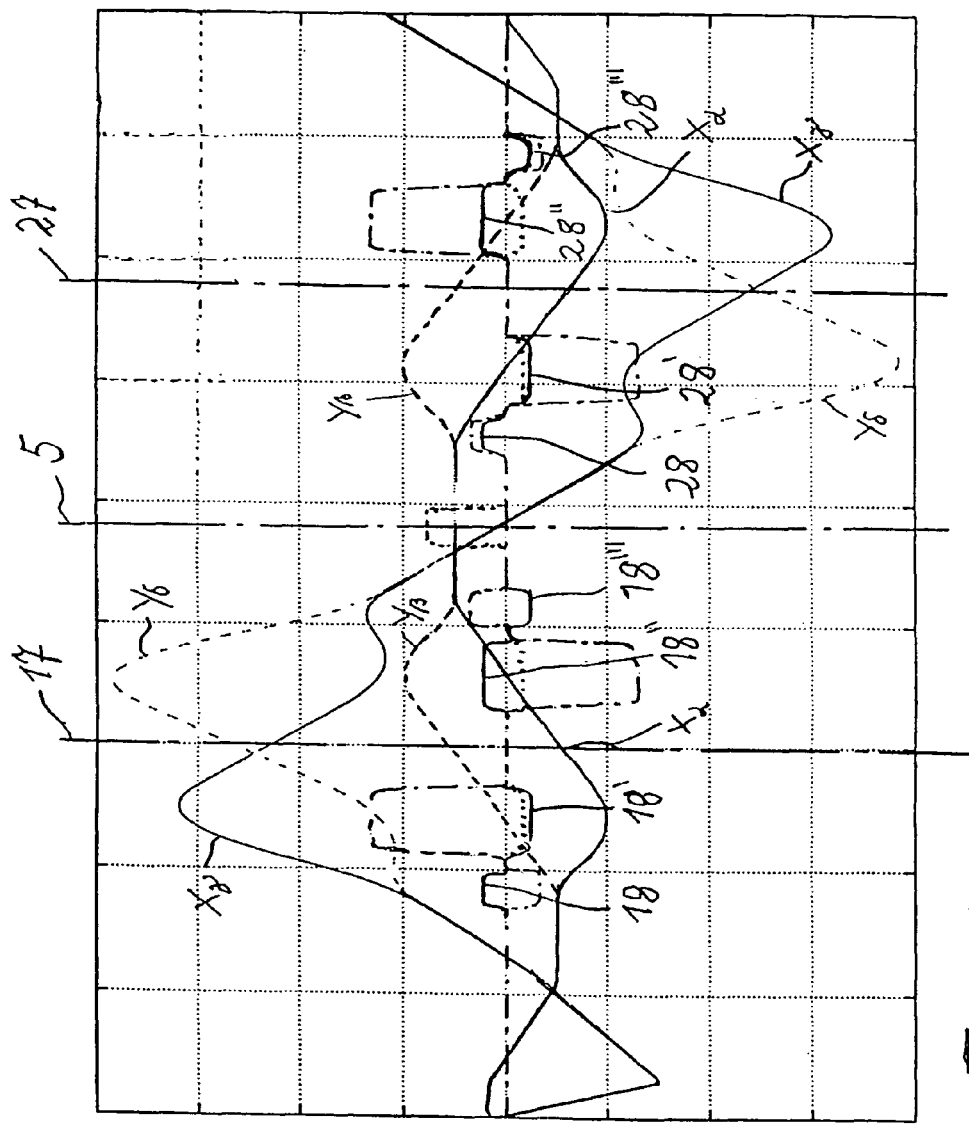
FIG. 4 shows the path and field dependences of FIG. 2 with additional octupole fields.

The above-mentioned corrections would also be possible using one of the correction pieces 10 or 20. The fact that two correction pieces 10 and 20 are disposed symmetrically with respect to the center plane 5 with reverse field order is due to the action of the corrector with respect to the dependence of the beams that image an off-axial point, and are illustrated in the form of off-axial fundamental paths $x_\gamma$ and $y_\delta$. This also results in different dependences of the path $x_\gamma$ in the x plane and of the path $y_\delta$ in the y plane, similar to the above-described, with separation of these fundamental paths $x_\gamma$ and $y_\delta$, deflections and recombination by the quadrupole fields 11', 12', 13', 14'; 24', 23', 22', 21' as shown in FIGS. 2, 3, and 4. In contrast to the axial fundamental paths $x_\alpha$ and $y_\beta$, no intermediate images are formed, and the $x_\gamma$ and $y_\beta$, paths do not extend symmetrically with respect to the center plane 5, rather in an anti-symmetrical or point-symmetrical manner. This results in opposing effects in the correction pieces 10 and 20 with respect to the off-axial paths $x_\gamma$ and $y_\delta$ with regard to causes of aberration. In consequence thereof, aberration-causing effects on electrons or ions are eliminated if these pass the correction pieces 10 and 20 in this anti-symmetrical fashion.

In order to correct an astigmatism of third order which is mainly generated during correction of the aperture aberration of third order, the invention finally proposes to generate an octupole field 4' through the central multipole element 4, which acts exactly at that location where the off-axial fundamental paths $x_\gamma$ and $y_\delta$ become zero. In this fashion, generation of other off-axial aberrations in consequence of this correction is prevented, since such aberrations cannot be caused in the axial region where the circular symmetrically disposed force fields cancel.

FIG. 3 shows the same path and field dependences as FIG. 2 but with additional twelve-pole fields 19, 19', 4", generated by the second and third multipole elements 12 and 13 of the first correction piece 10 and by the central multipole element 4. This arrangement is intended to correct axial aberrations of fifth order which are generated by aperture aberrations of third order at locations where octupoles 12''', 13'''; 23''', 22''' are present. Since the aperture aberrations of third order are successively reduced by the octupole fields 12''', 13'''; 23''', 22''', the contribution of the first correction piece to aberrations of fifth order are much higher than those of the second correction piece where the aperture aberrations of third order are already reduced. For this reason, the first correction piece is the favorable location for a correction of the aberrations of fifth order, which was extensively explained above.

FIG. 4 also shows the above-mentioned path and field dependences with additional octupole fields 18, 18', 18'', 18'''; 28, 28', 28'', 28''' on all multipoles 11, 12, 13, 14; 24, 23, 22, 21 which generate quadrupole fields 11' 12', 13', 14; 24', 23', 22', 21'. These additional octupole fields 18, 18', 18'', 18'''; 28, 28', 28'', 28''' are rotated through 22.5° with respect to the above-mentioned octupole fields 12''', 13'''; 23''', 22''' which are used to correct the aperture aberration, but are identically aligned relative to each other. The anti-symmetrical orientation of the octupole fields 18, 18', 18'', 18'''; 28, 28', 28'', 28''' with respect to the symmetry planes 17, 27 of the correction pieces 10, 20 and with respect to the center plane 5 may have the illustrated field strength dependence or these dependences may also pairwise face alternately in an upward or downward direction. The additional octupole fields 18, 18', 18'', 18'''; 28, 28', 28'', 28''' correct the anisotropic coma of the objective 34 (see FIG. 5) as a dominant off-axial aberration without introducing disturbing axial or off-axial aberrations.

The fields shown in FIGS. 2, 3, and 4 can be generated selectively or all at the same time in order to perform all mentioned corrections. They are shown in different figures only for reasons of clarity.

The description of the figures only serves to illustrate the invention. For this reason, reference is made to the above, more extensive description of the invention and its further embodiments. The generation of further fields, optionally also by further multipoles, naturally also lies within the scope of the invention in order to correct further fields of higher orders. In accordance with the invention, the above-described corrections may also be performed incompletely in order to obtain e.g. more image points, thereby accepting such disadvantages. As mentioned above, a complete correction of different aberrations can only be approached. 100% correction is not possible.

Figure 5:
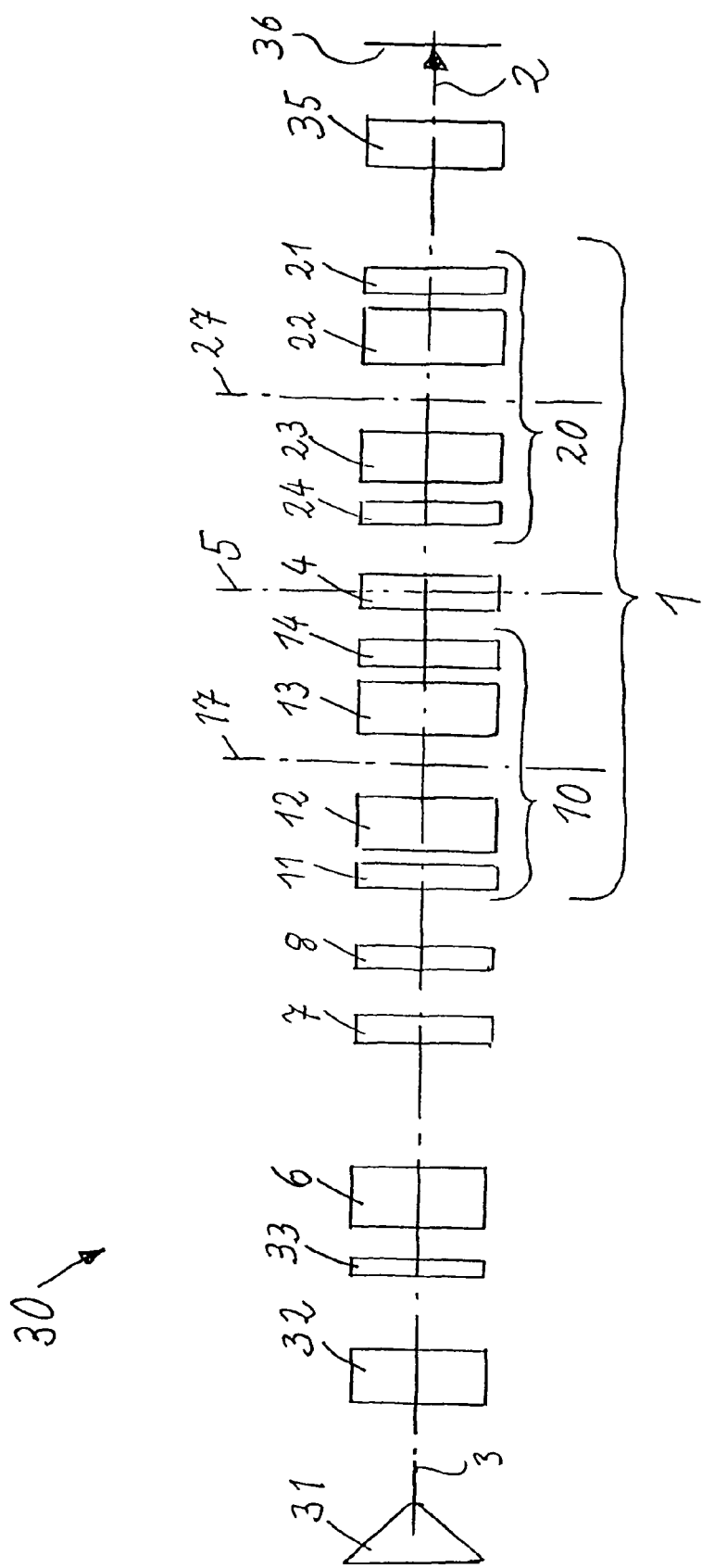
FIG. 5 shows a schematic diagram of an electron microscope.

FIG. 5 shows an electron microscope 30 into which the inventive corrector 1 including transfer lenses 7 and 8 is installed. The beam path 2 starts at a beam source 31, is focussed by a condenser 32, and penetrates through an object 33. The objective lens 6 and optionally also a projective lens 35 are used to generate an image, wherein the corrector 1 and optionally the intermediate lenses 7, 8 are disposed between the objective lens 6 and the projective lens 35. The latter can also be omitted. The image is then imaged on a screen 36 or the image points are electronically detected for illustration on a monitor.

Figure 6:
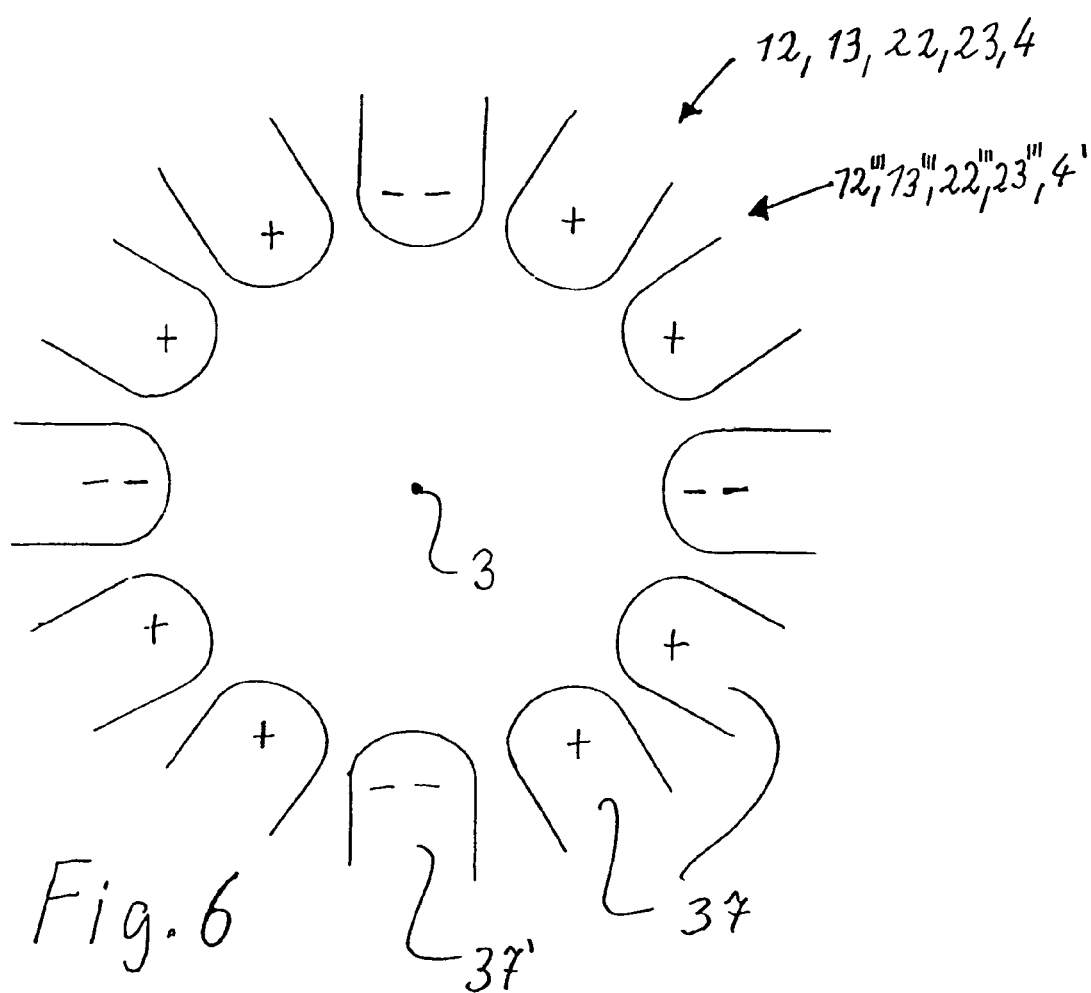
FIG. 6 shows a schematic diagram of a multipole element with twelve poles.

FIG. 6 shows a schematic illustration of a twelve-pole element, which may be the second 12, 23 or third multipole elements 13, 22, the central multipole element 4 or further multipole elements. The twelve poles 37, 37' are disposed axially symmetrically about the optical axis 3. If a twelve-pole field is thereby generated, the poles 37, 37' are alternately and successively formed as north and south poles for generating magnetic fields, or as negatively and positively charged electrodes for generating electric fields.

If a combined electric and magnetic field is to be generated, the soft iron cores of the electromagnets serve at the same time as electrodes which are loaded with a voltage.

For generating a quadrupole field, three electromagnets or electrodes 37, 37' having the same polarity or charge are always combined and the groups of three are alternately used as north and south poles or as negatively or positively charged electrodes. Electric and magnetic fields may thereby also be superposed. This superposition may be used as amplification or interaction such that magnetic and electric fields achieve chromatic aberration correction in accordance with a Wien filter as described above.

If, in contrast thereto, octupole fields 12''', 13'''; 23''', 22'''; 18, 18', 18'', 18'''; 28, 28', 28'', 28'''; 4' shall be generated, the poles 37, 37' must alternate, as is illustrated by the "+" and "−" signs. I.e. one negatively charged electrode 37' follows two positively charged electrodes 37 or vice versa, in an alternating fashion, wherein the negative charge (symbolized by two "−" signs") must be correspondingly strengthened in order to achieve an octupole field which is preferably not distorted. The corresponding applies for generating a magnetic octupole.

Superposed fields, such as quadrupole field, octupole field and twelve-pole field, generated by one single twelve-pole element are obtained by adding the currents or voltages in the respective poles, i.e. in the electromagnets or electrodes. In this fashion, all above-mentioned field superpositions can be produced, i.e. also two octupole fields which are rotated through 22.5° with respect to each other.

Field superpositions may thereby also be realized through superposed magnetic and electric fields in order to prevent field attenuations through superposition of opposing polarities.

It is naturally also possible to use multipoles with a higher pole number in order to obtain a more exact division of the fields. It is also possible to dispose multipoles of different subdivisions next to each other for generating different fields which need not necessarily act at exactly the same location.

LIST OF REFERENCE NUMERALS

1 corrector
2 beam path
3 optical axis
4 central multipole element
4' octupole field of the central multipole element
4'' twelve-pole field of the central multipole element
5 center plane
6 objective lens
7,8 transfer lenses
7',8' position of transfer lenses
10 first correction piece
11,12,13,14 first, second, third and fourth multipole element of the first correction piece
11',14' quadrupole fields of the first and fourth multipole element
12',13' magnetic quadrupole fields of the second and third multipole elements
12'',13'' electric quadrupole fields of the second and third multipole elements
12''',13''' octupole fields of the second and third multipole elements
15 astigmatic intermediate image of the axial beam path in the second multipole element
16 astigmatic intermediate image of the axial beam path in the third multipole element
17 symmetry plane of the first correction piece
18,18',18'',18''' octupole fields which are turned through 22.5° with respect to the octupole fields 12''', 13'''
19 twelve-pole field of the second multipole element
19' twelve-pole field of the third multipole element
20 second correction piece
24, 23, 22, 21 first, second, third, and fourth multipole element of the second correction piece
24', 21' quadrupole fields of the first and fourth multipole elements
23', 22' magnetic quadrupole fields of the second and third multipole elements
23'',22'' electric quadrupole fields of the second and third multipole elements
23''', 22''' octupole fields of the second and third multipole elements
25 astigmatic intermediate image of the axial beam path in the third multipole element
26 astigmatic intermediate image of the axial beam path in the second multipole element
27 symmetry plane of the second correction piece
28,28',28'',28''' octupole fields which are rotated through 22.5° with respect to the octupole fields 23''', 22'''
30 electron microscope (schematic diagram)
31 beam source
32 condenser
33 object
35 projective lens
36 monitor
37 pole as electromagnet and/or electrode (south pole or positively charged electrode)
37' pole as electromagnet and/or electrode (north pole or negatively charged electrode)
$x_\alpha, y_\beta$ fundamental paths of the axial beam path
$x_\gamma, y_\delta$ fundamental paths of the off-axial beam path

We claim:

1. A corrector for axial and off-axial beam paths of a particle-optical system, the corrector comprising:
a first correction piece;
a second correction piece disposed behind said first correction piece in a beam path on an optical axis, wherein each of said first and said second correction pieces comprises four successive multipole elements disposed symmetrically with respect to a center plane, wherein a first and a fourth multipole element of each of said first and said second correction pieces generate quadrupole fields and a second and a third multipole element of each of said first and said second correction pieces generate superposed magnetic and electric octupole fields and quadrupole fields, wherein quadrupole fields of all four multipole elements are successively rotated from one to the next through 90° to enable chromatic aberration correction using astigmatic intermediate images in said second and third multipole elements through interaction of said magnetic and electric fields as well as aperture aberration correction using said quadrupole fields and said octupole fields; and
a central multipole element disposed in said center plane, said central multipole element generating an octupole field for eliminating an astigmatism of third order.

2. The corrector of claim 1, wherein twelve-pole fields are generated using said second and third multipole elements of said first correction piece and said central multipole element for correcting aberrations of fifth order.

3. The corrector of claim 2, wherein a star aberration of fifth order, a rosette aberration of fifth order, and an astigmatism of fifth order are each corrected with one of the twelve-pole fields.

4. The corrector of claim 1, wherein further octupole fields are generated for correcting an anisotropic coma of an objective lens using said multipole elements, said further octupole fields being rotated through 22.5° with respect to said octupole fields for correcting said aperture aberration, wherein the octupole field strengths are anti-symmetrical with respect to symmetry planes of said first and said second correction pieces and with respect to said center plane.

5. The corrector of claim 1, wherein at least said second and third multipole-elements of said first and second correction pieces and said central multipole element are twelve-pole elements which, by means of a controller, can generate differing, up to twelve-pole, fields, including superposition of different fields through a corresponding current and/or voltage load.

6. The corrector of claim 1, wherein two round transfer lenses are associated with the corrector on an objective side, a field setting of which can eliminate or substantially reduce aperture aberrations of fifth order and/or radial coma of third order.

7. The corrector of claim 6, wherein said quadrupole and octupole fields of said second and third multipole elements of said first and second correction pieces and said octupole field of said central multipole element are subjected to a readjustment, such that said field setting of said transfer lenses eliminates newly caused chromatic aberrations of first order and aperture aberrations of third order.

8. The corrector of claim 7, wherein twelve-pole fields of said second and third multipole elements of said first corrector and a twelve-pole field of said central multipole element can be readjusted to eliminate aberrations of higher order caused by said transfer lenses and said readjustment.

9. The corrector of claim 8, wherein chromatic aberrations of first order, aperture aberrations of third order, and aberrations of higher order caused by aberration corrections are eliminated through readjustment of said transfer lenses, said quadrupole fields of said first and second correction pieces, and said octupole fields of said first and second correction pieces and of said central multipole element and by subsequent readjustment of said twelve-pole fields of said first correction piece and of said central multipole element and then by readjustment of further octupole fields of all said multipole elements that generate quadrupole fields followed by iterative readjustment, in the above-mentioned sequence, for reducing aberrations caused by respective previous readjustments until those alternations are reduced to an amount that can be tolerated for a desired imaging.

10. The corrector of claim 1, wherein an image resolution of up to 10,000 image points along an image diameter can be obtained by allowing a small aperture aberration of fifth order.

11. A transmission electron microscope having correction of an electron beam using the corrector of claim 1.

* * * * *